(12) United States Patent
Okada et al.

(10) Patent No.: US 11,189,554 B2
(45) Date of Patent: Nov. 30, 2021

(54) SEMICONDUCTOR DEVICE

(71) Applicant: NuFlare Technology, Inc., Yokohama (JP)

(72) Inventors: Shiro Okada, Sagamihara (JP); Mie Matsuo, Kamakura (JP); Hiroshi Yamashita, Sagamihara (JP); Shinsuke Nabeya, Chuo-ku (JP); Kenichi Kataoka, Setagaya-ku (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/547,960

(22) Filed: Aug. 22, 2019

(65) Prior Publication Data
US 2020/0091056 A1 Mar. 19, 2020

(30) Foreign Application Priority Data
Sep. 19, 2018 (JP) .............................. JP2018-175432

(51) Int. Cl.
*H01L 23/498* (2006.01)
*H01J 37/147* (2006.01)
*H01J 37/317* (2006.01)

(52) U.S. Cl.
CPC .... *H01L 23/49827* (2013.01); *H01J 37/1472* (2013.01); *H01J 37/3177* (2013.01); *H01L 23/49838* (2013.01); *H01J 2237/0437* (2013.01)

(58) Field of Classification Search
CPC ............. H01L 23/498; H01L 23/49838; H01L 23/49833; H01L 23/49827; H01L 23/00;
(Continued)

(56) References Cited

U.S. PATENT DOCUMENTS 7,714,298 B2  5/2010  Platzgummer
2004/0169147 A1*  9/2004  Ono ...................... B82Y 10/00
                                                              250/396 R
(Continued)

FOREIGN PATENT DOCUMENTS

CN          1525259 A      9/2004
KR   10-2017-0135718 A    12/2017
(Continued)

OTHER PUBLICATIONS

Combined Taiwanese Office Action and Search Report dated Jun. 12, 2020 in Patent Application No. 106128727 (with unedited computer generated English translation), 16 pages.
(Continued)

*Primary Examiner* — Chuong A Luu
(74) *Attorney, Agent, or Firm* — Oblon, McClelland, Maier & Neustadt, L.L.P.

(57) ABSTRACT

A semiconductor device according to the embodiments includes: a first substrate having a plurality of first through-holes; a plurality of first electrodes provided on the first substrate to be adjacent to the respective first through-holes; a plurality of second electrodes provided on the first substrate to be adjacent to the respective first through-holes and to face the respective first electrodes; and a second substrate provided to face the first substrate, the second substrate having a plurality of second through-holes facing the respective first through-holes, at least a surface of the second substrate facing the first substrate having conductivity, the second substrate being electrically connected to the second electrodes.

17 Claims, 8 Drawing Sheets

(58) Field of Classification Search
CPC . H01L 23/535; H01L 23/525; H01L 23/5221; H01L 23/5248; H01L 23/5382; H01J 37/06; H01J 37/045; H01J 37/302; H01J 37/1472; H01J 37/3177; H01J 2237/0437
USPC ........................................................ 257/774
See application file for complete search history.

(56) References Cited

U.S. PATENT DOCUMENTS

| | | | | |
|---|---|---|---|---|
| 2005/0221538 | A1* | 10/2005 | Suzuki | H01L 23/488 438/126 |
| 2005/0242302 | A1* | 11/2005 | Platzgummer | G21K 1/08 250/492.22 |
| 2010/0072598 | A1* | 3/2010 | Oh | H01L 23/481 257/686 |
| 2010/0078655 | A1* | 4/2010 | Yang | H01L 23/49816 257/81 |
| 2015/0102231 | A1* | 4/2015 | Matsumoto | H01J 37/3177 250/396 R |
| 2019/0062151 | A1* | 2/2019 | Cheng | B81C 1/00269 |

FOREIGN PATENT DOCUMENTS

| | | |
|---|---|---|
| TW | 201739685 A | 11/2017 |
| TW | 201805987 A | 2/2018 |

OTHER PUBLICATIONS

Korean Office Action dated Dec. 15, 2020 in Korean Patent Application No. 10-2019-0108715 (with English translation), 11 pages.
Taiwanese Office Action dated Dec. 21, 2020 in Taiwanese Patent Application No. 108128727 (with English translation), 11 pages.

* cited by examiner

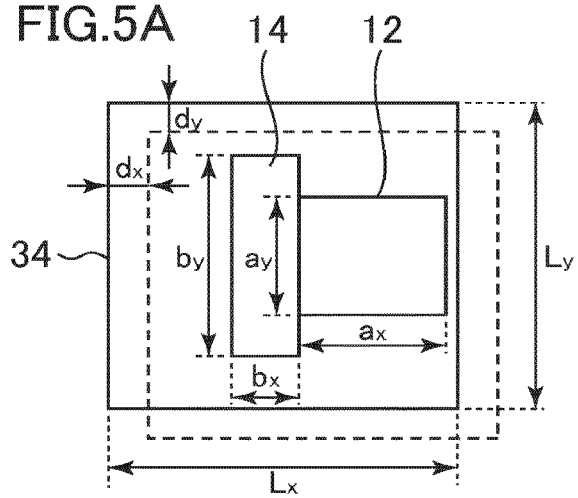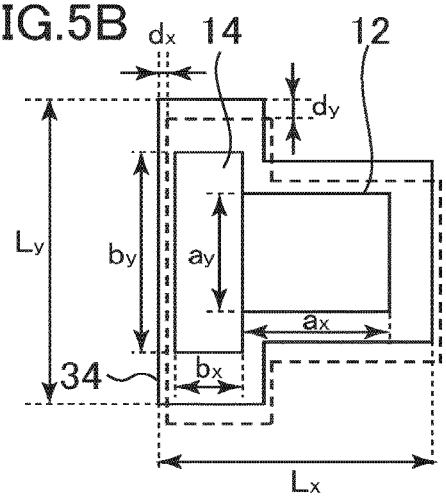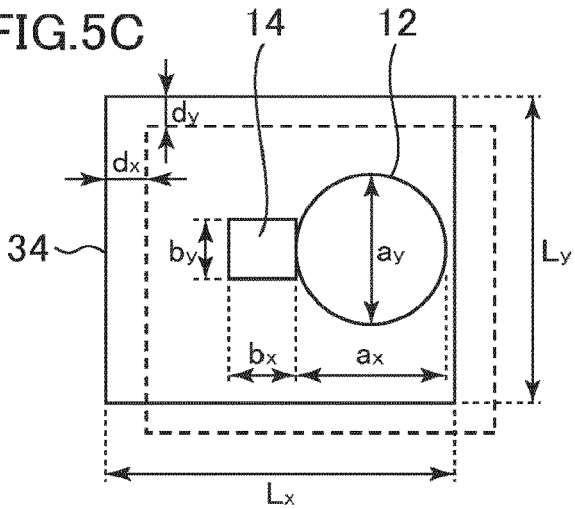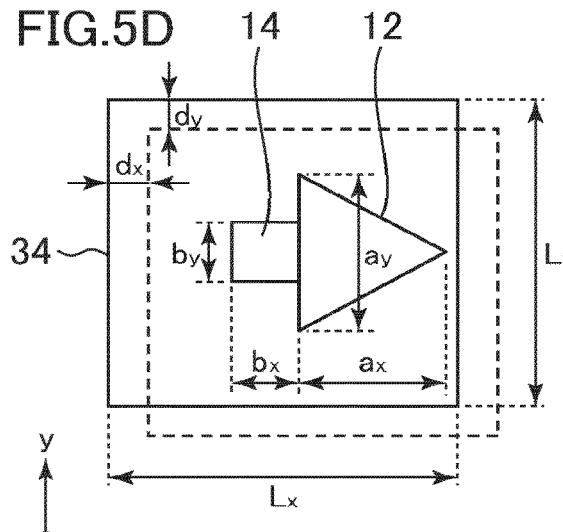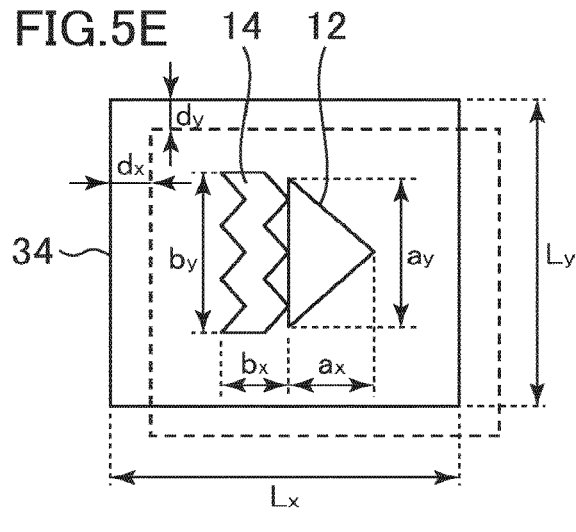

SEMICONDUCTOR DEVICE

CROSS-REFERENCE TO RELATED APPLICATION

This application is based upon and claims the benefit of priority from Japanese Patent Applications No. 2018-175432, filed on Sep. 19, 2018, the entire contents of which are incorporated herein by reference.

FIELD OF THE INVENTION

Embodiments relate to a semiconductor device.

BACKGROUND OF THE INVENTION

Lithography technology having a role for the progress of miniaturization of semiconductor devices is a very important process. In recent years, with the high integration of LSI, the circuit line width required for a semiconductor device has been miniaturized year by year. Since electron beam drawing technology has inherently excellent resolution, drawing a mask pattern on a mask blank by using the electron beam is performed.

In comparison with the case of drawing one electron beam, a drawing apparatus using multiple electron beams (multi-beams) can significantly improve throughput. In such a multi-beam drawing apparatus, for example, an electron beam emitted from an electron gun is allowed to pass through a shaping aperture having a plurality of holes, so that a multi-beam is formed. The respective electron beams constituting the formed multi-beam are blanking-controlled by a blanking aperture array. The electron beam deflected by the blanking aperture array is shielded (blanked), and a sample such as a mask blank is irradiated with the undeflected electron beam.

The blanking aperture array is provided with through-holes through which the respective electron beams pass. Then, an electrode pair for deflecting the electron beam is provided around the through-hole. In the manufacturing of the blanking aperture array, for example, a method of forming the respective through-holes, the respective electrode pairs, and the like in a silicon (Si) substrate by using a semiconductor manufacturing technology is employed.

In the drawing of the pattern by using the multi-beam, each electron beam can be deflected independently by an electric field generated by a voltage applied between the electrodes of the electrode pair provided in the blanking aperture array. At this time, there is a problem in that unintended beam deflection and crosstalk occur due to the influence of an electric field generated by an electrode pair other than the electrode pair for deflecting the electron beam to be processed.

SUMMARY OF THE INVENTION

A semiconductor device according to an embodiment includes: a first substrate having a plurality of first through-holes; a plurality of first electrodes provided on the first substrate to be adjacent to the respective first through-holes; a plurality of second electrodes provided on the first substrate to be adjacent to the respective first through-holes and to face the respective first electrodes; and a second substrate provided to face the first substrate, the second substrate having a plurality of second through-holes facing the respective first through-holes, at least a surface of the second substrate facing the first substrate having conductivity, the second substrate being electrically connected to the second electrodes.

BRIEF DESCRIPTION OF THE DRAWINGS

FIGS. 5A to 5E are schematic views illustrating examples of a first through-hole, a second through-hole, and a power supply electrode in the semiconductor device according to the first embodiment;

DETAILED DESCRIPTION OF THE EMBODIMENTS

Figure 1:
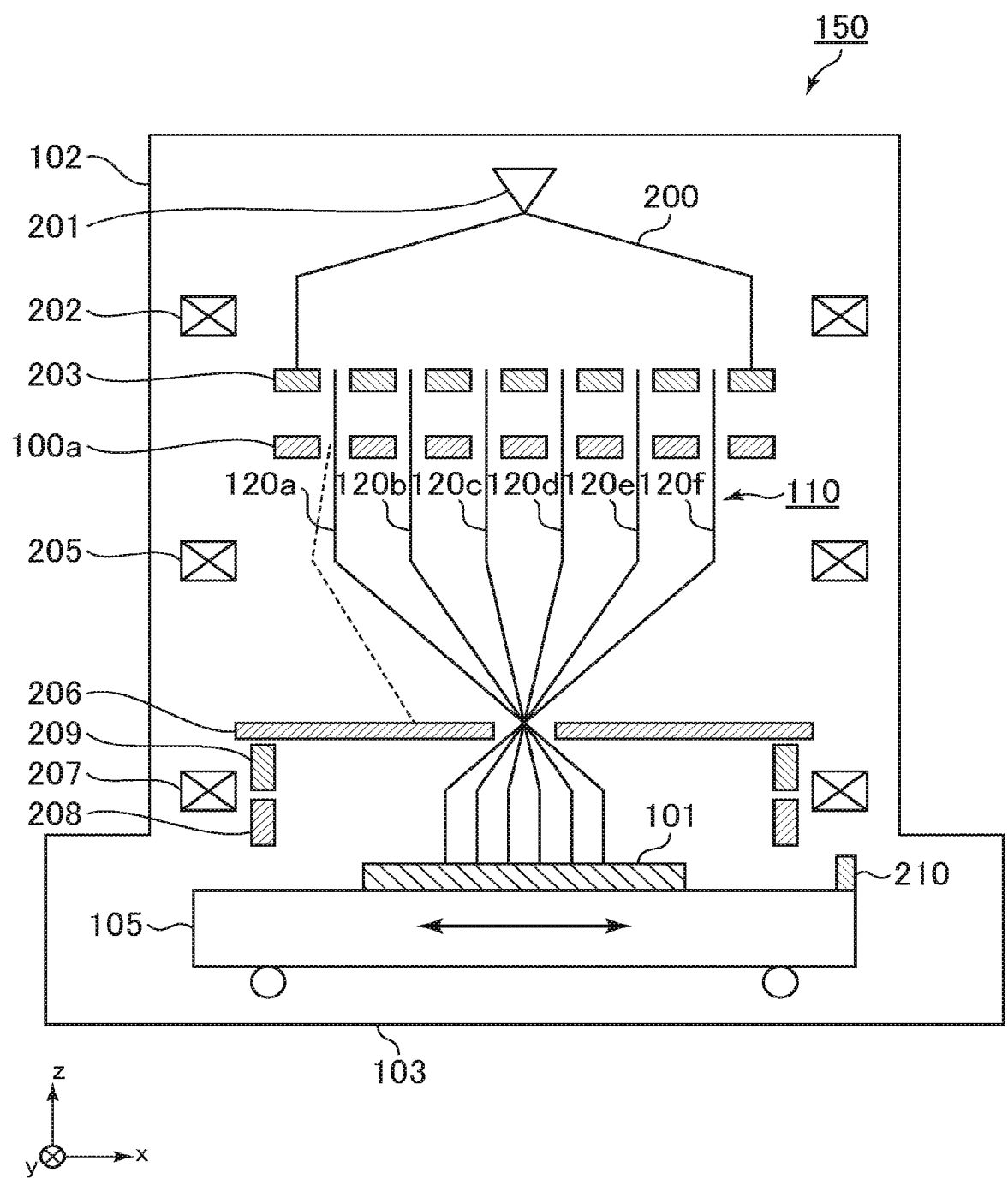
FIG. 1 is a schematic cross-sectional view of an electron beam drawing apparatus according to a first embodiment.

Hereinafter, embodiments will be described with reference to the drawings. In the drawings, the same or similar components are denoted by the same or similar reference numerals.

In the present specification, the same or similar members will be denoted by the same reference numerals, and redundant descriptions may be omitted.

In the present specification, in order to indicate the positional relationship of parts and the like, the upper direction of the drawing is described as "upper" and the lower direction of the drawing is described as "lower". In the present specification, the terms "upper" and "lower" are not necessarily terms indicating the relationship with the direction of gravity.

Hereinafter, a configuration using an electron beam as an example of a charged particle beam will be described. However, the charged particle beam is not limited to the electron beam, and a beam using charged particles such as an ion beam may be used.

First Embodiment

A semiconductor device according to an embodiment includes: a first substrate having a plurality of first through-holes; a plurality of first electrodes provided on the first substrate to be adjacent to the respective first through-holes; a plurality of second electrodes provided on the first substrate to be adjacent to the respective first through-holes and to face the respective first electrodes; and a second substrate provided to face the first substrate, the second substrate having a plurality of second through-holes facing the respective first through-holes, at least a surface of the second substrate facing the first substrate having conductivity, the second substrate being electrically connected to the second electrodes.

FIG. 1 is a schematic cross-sectional view of an electron beam drawing apparatus 150 according to an embodiment.

The electron beam drawing apparatus 150 is an example of a multi-charged particle beam drawing apparatus.

A semiconductor device 100a according to the embodiment is a blanking aperture array used in the electron beam drawing apparatus 150.

The electron beam drawing apparatus 150 includes an electron lens barrel 102 (multi-electron beam column) and a drawing chamber 103. In the electron lens barrel 102, an electron gun 201, an illumination lens 202, a shaping aperture array 203, the semiconductor device 100a (blanking aperture array), a reduction lens 205, a limiting aperture member 206, an objective lens 207, a main deflector 208, and an auxiliary deflector 209 are disposed.

Herein, an orthogonal coordinate system (x-axis, y-axis, and z-axis) is defined. That is, the x-axis, the y-axis orthogonal to the x-axis, and the z-axis orthogonal to both the x-axis and the y-axis are defined. It is assumed that the electron gun 201 emits an electron beam 200 to the z-direction. Further, it is assumed that a sample 101 is disposed in a plane parallel to the xy plane. The x direction is an example of a first direction, and the y direction is an example of a second direction.

The shaping aperture array 203 is illuminated with the electron beam 200 emitted from the electron gun 201 almost perpendicularly by the illumination lens 202. Then, the electron beam 200 passes through the opening of the shaping aperture array 203, so that a multi-beam 110 is formed. The multi-beam 110 includes electron beams 120a, 120b, 120c, 120d, 120e, and 120f. The shape of each electron beam 120 reflects the shape of the respective opening of the shaping aperture array 203 and is, for example, a rectangle. In addition, although it is illustrated in FIG. 1 that the number of openings of the shaping aperture array 203 is six, the number of openings is not limited to six. The number of multi-beams 110 formed by the shaping aperture array 203 is six in FIG. 1. However, of course, the number of multi-beams 110 to be formed is not limited to six. As an example, the openings of the shaping aperture array 203, of which number is 512 in each of the x direction and the y direction, are disposed in a matrix shape.

The semiconductor device 100a as a blanking aperture array is provided under the shaping aperture array 203. The electron beam 120 deflected by the semiconductor device 100a is deviated from the hole at the center of the limiting aperture member 206 and is shielded by the limiting aperture member 206. On the other hand, the undeflected electron beam 120 passes through the hole at the center of the limiting aperture member 206. As a result, on and off of the electron beam are controlled.

The electron beam 120 which has passed through the limiting aperture member 206 is focused by the objective lens 207 to form a pattern image with a desired reduction ratio and is collectively deflected by the main deflector 208 and the auxiliary deflector 209. Then, each irradiation position on the sample 101 placed on an XY stage 105 is irradiated. In addition, a mirror 210 for measuring the position of the XY stage 105 is disposed on the XY stage 105.

Figure 2:
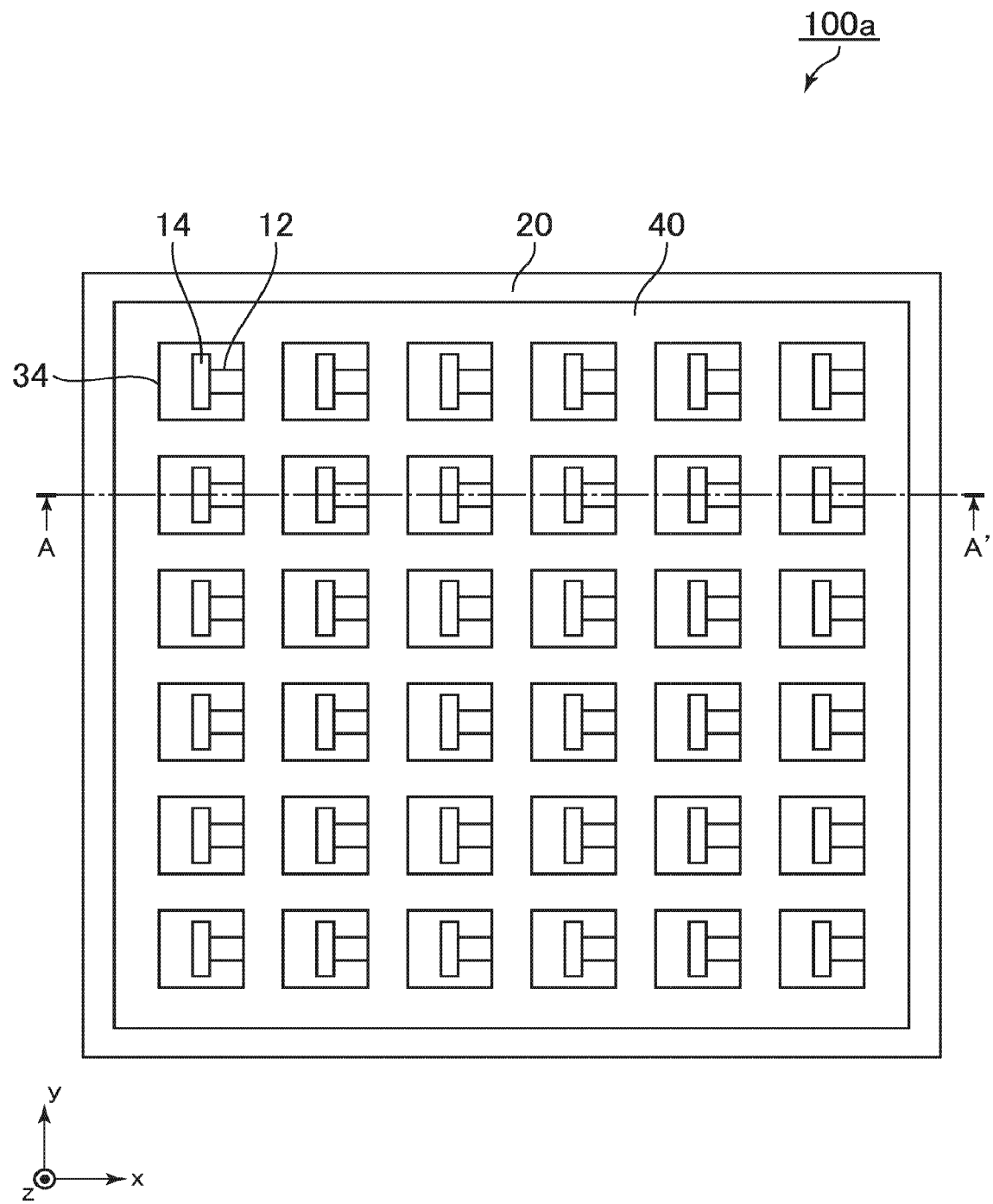
FIG. 2 is a schematic top view of a semiconductor device according to the first embodiment.
Figure 3:
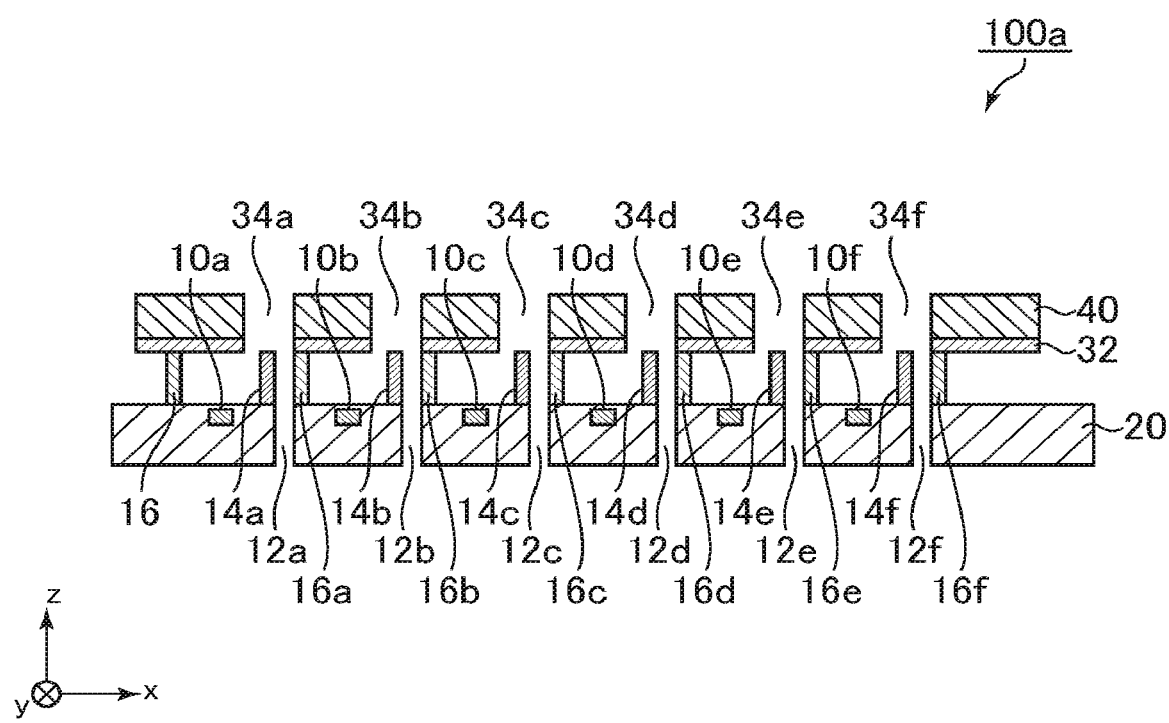
FIG. 3 is a schematic cross-sectional view of the semiconductor device according to the first embodiment.

FIG. 2 is a schematic top view of the semiconductor device 100a according to the embodiment. FIG. 3 is a schematic cross-sectional view taken along line A-AT of the semiconductor device 100a according to the embodiment illustrated in FIG. 2. The semiconductor device 100a according to the embodiment will be described with reference to FIGS. 2 and 3.

A first substrate 20 is, for example, a semiconductor substrate such as a silicon substrate. In FIGS. 2 and 3, the substrate surface of the first substrate 20 is disposed parallel to the xy plane.

The first substrate 20 includes a plurality of first through-holes 12. In FIG. 3, as the plurality of first through-holes, first through-holes 12a, 12b, 12c, 12d, 12e, and 12f are illustrated. In FIG. 2, it is illustrated that six first through-holes 12 are disposed in each of the x direction and the y direction. In addition, of course, the number of the first through-holes 12 is not limited to six.

A plurality of power supply electrodes 14 (examples of first electrodes) are provided in the vicinity of the respective first through-holes 12 on the first substrate 20. In FIG. 3, power supply electrodes 14a, 14b, 14c, 14d, 14e, and 14f are provided around the respective first through-holes 12a, 12b, 12c, 12d, 12e, and 12f.

Ground electrodes 16 (examples of second electrodes) are provided on the first substrate 20. In FIG. 3, the ground electrodes 16 are provided so as to face the power supply electrodes 14 with the first through-holes 12 interposed between the ground electrodes 16 and the power supply electrodes 14. For example, the ground electrodes 16a, 16b, 16c, 16d, 16e, and 16f are provided so as to face the respective power supply electrodes 14a, 14b, 14c, 14d, 14e, and 14f with the first through-holes 12a, 12b, 12c, 12d, 12e, and 12f interposed between the ground electrodes 16a, 16b, 16c, 16d, 16e, and 16f and the power supply electrodes 14a, 14b, 14c, 14d, 14e, and 14f. The respective ground electrodes 16 are connected to each other, for example, in a portion (not illustrated) and are grounded to aground (not illustrated) to be used in the electron beam drawing apparatus 150.

Circuits 10 are provided in the first substrate 20. In FIG. 3, as the circuits 10, circuits 10a, 10b, 10c, 10d, 10e, and 10f are illustrated. For example, the circuits 10a, 10b, 10c, 10d, 10e, and 10f are connected to the respective power supply electrodes 14a, 14b, 14c, 14d, 14e, and 14f by wires (not illustrated). The circuits 10 have a function of applying a predetermined voltage of, for example, about 5 V to the power supply electrodes 14. The circuits 10 are, for example, complementary metal-oxide-semiconductor (CMOS) circuits.

The second substrate 40 is provided to face the first substrate 20. The second substrate 40 is, for example, a semiconductor substrate such as a Si substrate. In addition, at least a surface of the second substrate 40 facing the first substrate 20 needs to be conductive. As illustrated in FIG. 3, the second substrate in which the conductive film 32 is formed on the surface can be used. For example, the second substrate in which a metal film such as gold (Au) is formed on the surface of a Si substrate is preferable. In addition, other metal substrates can be preferably used.

The second substrate 40 has a plurality of second through-holes 34. The plurality of second through-holes 34 are provided on the plurality of first through-holes 12, respectively. In FIG. 3, the second through-holes 34a, 34b, 34c, 34d, 34e, and 34f are provided on the first through-holes 12a, 12b, 12c, 12d, 12e, and 12f, respectively.

In addition, the second through-holes 34a, 34b, 34c, 34d, 34e, and 34f are provided on the respective power supply electrodes 14a, 14b, 14c, 14d, 14e, and 14f so that the power supply electrode 14 and the second substrate 40 are not in contact with each other. In other words, the respective first through-holes 12a, 12b, 12c, 12d, 12e, and 12f and the respective power supply electrodes 14a, 14b, 14c, 14d, 14e, and 14f are provided under the second through-holes 34a, 34b, 34c, 34d, 34e, and 34f. In consideration of misalignment when attaching the second substrate 40 on the first substrate 20, the size of the second through-hole 34 is preferably larger than the size of the first through-hole 12.

On the other hand, the size of the second through-hole 34 may be the same as or smaller than the size of the first through-hole 12 as long as the passage of the electron beam 120 is not hindered. In this case, by setting the size of the second through-hole 34 to a desired size smaller than the size of the first through-hole 12, the second substrate 40 can also have the function of the shaping aperture array 203, and the second through-holes 34 can form a multi-beam.

In addition, as a material of the second substrate 40, a heavy metal such as tungsten (W) or gold (Au) is used, and the second substrate 40 may have an X-ray shielding function. At this time, the size of the second through-hole 34 is set to a desired size smaller than the size of the first through-hole 12, and thus, the second substrate 40 may have both the function of the shaping aperture array 203 and the X-ray shielding function.

The thickness of the second substrate 40 is determined in consideration of the processability only depending on the size, bending, and the like of the second through-hole 34 and the transmittance of the electron beam 120. The thickness of the second substrate 40 is preferably 10 µm or more. If the thickness of the second substrate 40 is set to be less than 10 µm, the processing of the second substrate 40 becomes difficult. In addition, the thickness of the second substrate 40 is preferably, for example, 200 µm or less in order to allow the electron beam 120 to pass through the second through-hole 34 without hitting the sidewall surface. However, from the viewpoint of the crosstalk suppression effect, the thickness of the second substrate 40 may be larger than 200 µm or may be smaller than 10 µm, but a thicker thickness is more preferable.

The conductive film 32 of the second substrate 40 is provided on the surface of the second substrate 40 facing the first substrate 20 and is electrically connected to the ground electrode 16. The conductive film 32 is, for example, a film of gold (Au), but the conductive film 32 is not limited to the film of Au. In addition, the conductive film 32 may be formed entirely or partly on the surface of the second substrate 40 facing the first substrate 20 or may be formed in the through-hole.

The first substrate 20 and the second substrate 40 are disposed, for example, in parallel to the xy plane.

The electron beam 120 shaped by the shaping aperture array 203 passes through each of the second through-hole 34 and the first through-hole 12. Herein, for example, when a predetermined voltage is applied to the power supply electrode 14a by using the circuit 10a, electric fields are generated between the ground electrode 16a and the power supply electrode 14a, between the conductive film 32 and the power supply electrode 14a, and between the second substrate 40 and the power supply electrode 14a. The generated electric fields deflect the electron beam 120 passing through the second through-holes 34a and the first through-holes 12a.

In addition, the electron beam 120 may pass from the second through-hole 34 toward the first through-hole 12 or may pass from the first through-hole 12 toward the second through-hole 34. However, in a case where the second substrate 40 has a function of the shaping aperture array 203, an X-ray shielding function, or both functions, the electron beam 120 passing from the second through-hole 34 toward the first through-hole 12 is effective.

The vertical distance (the distance in the Z direction or the distance in the direction perpendicular to the second substrate 40) between the power supply electrode 14 and the second substrate 40 (conductive film 32) is preferably 30 µm or less, more preferably, 10 µm or less from the viewpoint of crosstalk suppression. The vertical distance between the power supply electrode 14 and the second substrate 40 is most preferably zero.

Figure 4:
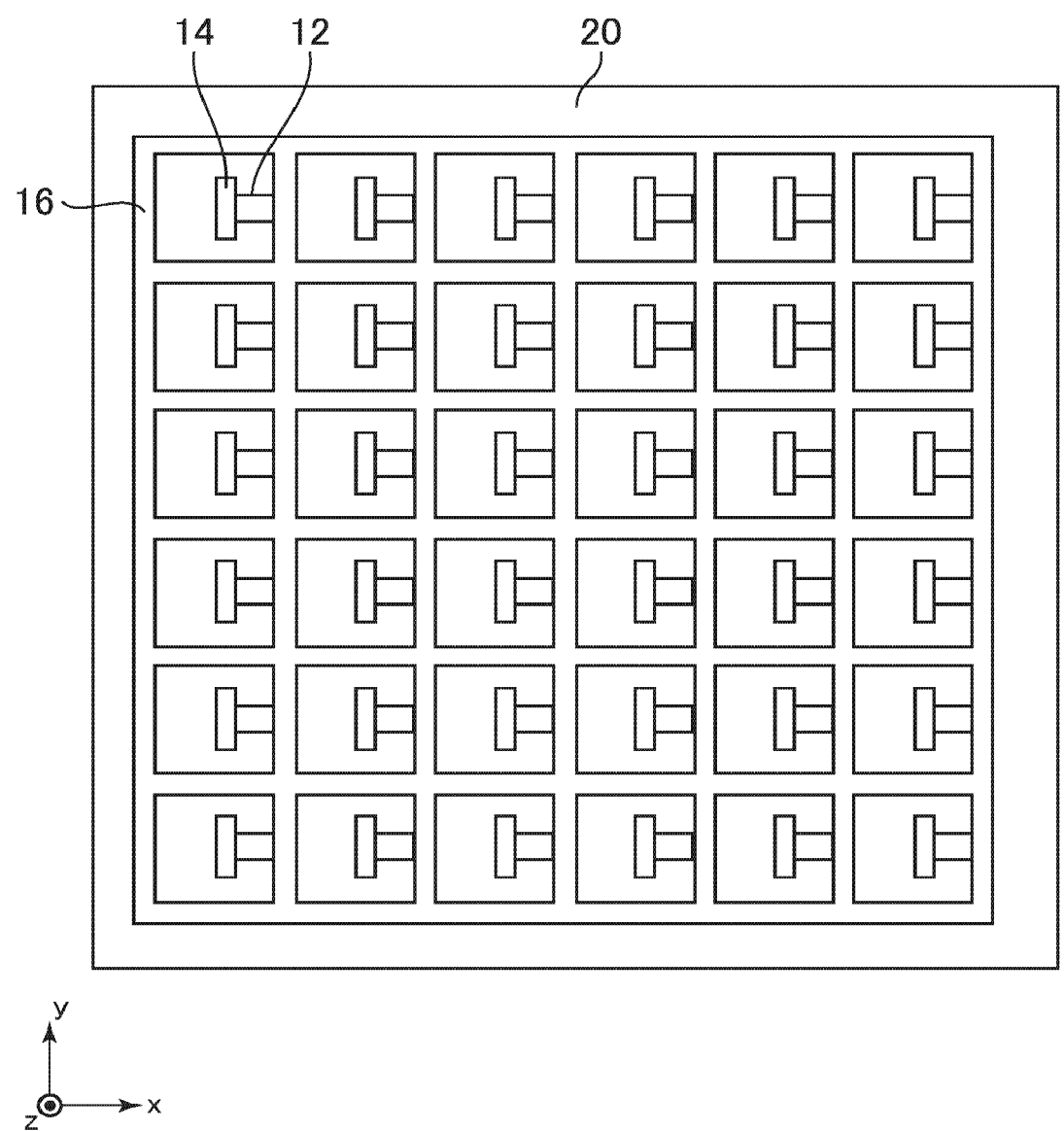
FIG. 4 is a schematic top view illustrating an example of a main portion of the semiconductor device according to the first embodiment.

FIG. 4 is a schematic top view illustrating an example of the main portion of the semiconductor device 100a according to the embodiment. FIG. 4 is a schematic top view illustrating the semiconductor device 100a illustrated in FIG. 2 excluding the second substrate 40. The ground electrode 16 is provided on the first substrate and has a grid shape, and the first through-hole 12 and the power supply electrode 14 provided on the first substrate are disposed inside each of the grids. In other words, the ground electrodes 16 are provided to surround the first through-holes 12 and the power supply electrodes 14.

FIGS. 5A to 5E are schematic views illustrating examples of the first through-hole 12, the second through-hole 34, and the power supply electrode 14 in the semiconductor device 100a according to the embodiment.

The disposition of the first through-hole 12, the second through-hole 34, and the power supply electrode 14 will be described with reference to FIG. 5A. The length of the second through-hole 34 in the x direction is denoted by $L_x$, and the length in the y direction is denoted by $L_y$. The length of the first through-hole 12 in the x direction is denoted by $a_x$, and the length in the y direction is denoted by $a_y$. The length of the power supply electrode 14 in the x direction is denoted by $b_x$, and the length in the y direction is denoted by $b_y$.

From the viewpoint of suppressing crosstalk, it is preferable that the second through-hole 34 is as small as the electron beam 120 can pass through. However, when the second substrate 40 is disposed on the first substrate 20, in some cases, the second substrate 40 may be disposed to be deviated by $d_x$ in the x direction and $d_y$ in the y direction from the predetermined position with respect to the first substrate 20. Therefore, in the x direction, it is preferable that $2d_x+b_x+a_x \leq L_x$ is satisfied. In addition, in the y direction, it is preferable that $2d_y+a_y \leq L_y$ and $2d_y+b_y \leq L_y$ are satisfied.

Further, the opening shape of the second through-hole 34 is not limited to a quadrangle and may be a polygon or the like. As illustrated in FIG. 5B, the polygon formed with the power supply electrode 14 and the first through-hole 12 is set to be substantially similar (similar) to the shape obtained by combining the top surface shapes of the power supply electrode 14 and the first through-hole 12, of which outline is enlarged in consideration of the respective bonding errors $d_x$ and $d_y$, so that the opening area can be further reduced, and thus, it is possible to further increase the crosstalk suppression effect.

FIGS. 5C, 5D, and 5E illustrate another aspect of the first through-hole 12 and the power supply electrode 14. In FIGS. 5A and 5B, the shapes of the first through-hole 12, the second through-hole 34, and the power supply electrode 14 are all rectangles. However, the shapes of the first through-hole 12, the second through-hole 34, and the power supply electrode 14 are not limited to these shapes. In FIG. 5C, the shape of the first through-hole 12 is a circle. In FIG. 5D, the shape of the first through-hole 12 is a triangle. In FIG. 5E, the shape of the first through-hole 12 is a triangle, and the shape of the power supply electrode 14 is a waveform. Any of FIGS. 5C, 5D, and 5E can be preferably used. And, in each case, in the x-directions, it is preferable that $2d_x+b_x+$ $a_x \leq L_x$ is satisfied. In addition, in each case, in the y direction, it is preferable that $2d_y + a_y \leq L_y$ and $2d_y + b_y \leq L_y$ are satisfied.

Next, the functions and effects of the embodiment will be described.

In order to suppress the crosstalk, the second substrate 40 having conductivity is disposed on the first substrate 20 having the circuits 10, the power supply electrodes 14 and the ground electrodes 16. This is to shield the electric field generated between the power supply electrode 14 and the ground electrode 16 by the second substrate 40, so that the electric field does not reach the vicinity of other power supply electrodes 14. From the viewpoint, it is preferable that the distance between the power supply electrode 14 and the second substrate 40 and the distance between the ground electrode 16 and the second substrate 40 are as small as possible. The same is applied to a case where the second substrate 40 has the function of the shaping aperture array 203, the X-ray shielding function, or both functions.

In order to obtain a shielding effect, it is difficult to maintain the first substrate 20 and the second substrate 40 in parallel to each other while maintaining the distance to the second substrate 40 as small as possible so that the power supply electrode 14 and the ground electrode 16 are not short-circuited.

Therefore, in the semiconductor device 100a according to the embodiment, the conductive film 32 is provided on the surface of the second substrate 40 facing the first substrate 20, and the conductive film 32 is electrically connected to the ground electrode 16. Then, a second through-hole is provided so that the second substrate 40 and the power supply electrode 14 are not in contact with each other. Since the distance between the first substrate 20 and the second substrate 40 can be reduced in this manner, it is possible to more reliably suppress crosstalk.

According to the semiconductor device 100a according to the embodiment, it is possible to provide a semiconductor device capable of suppressing crosstalk.

Second Embodiment

A semiconductor device according to this embodiment is different from the semiconductor device according to the first embodiment in that a portion of the second substrate is provided on the plurality of first electrodes. Herein, the same points as those of the first embodiment are omitted in description.

Figure 6:
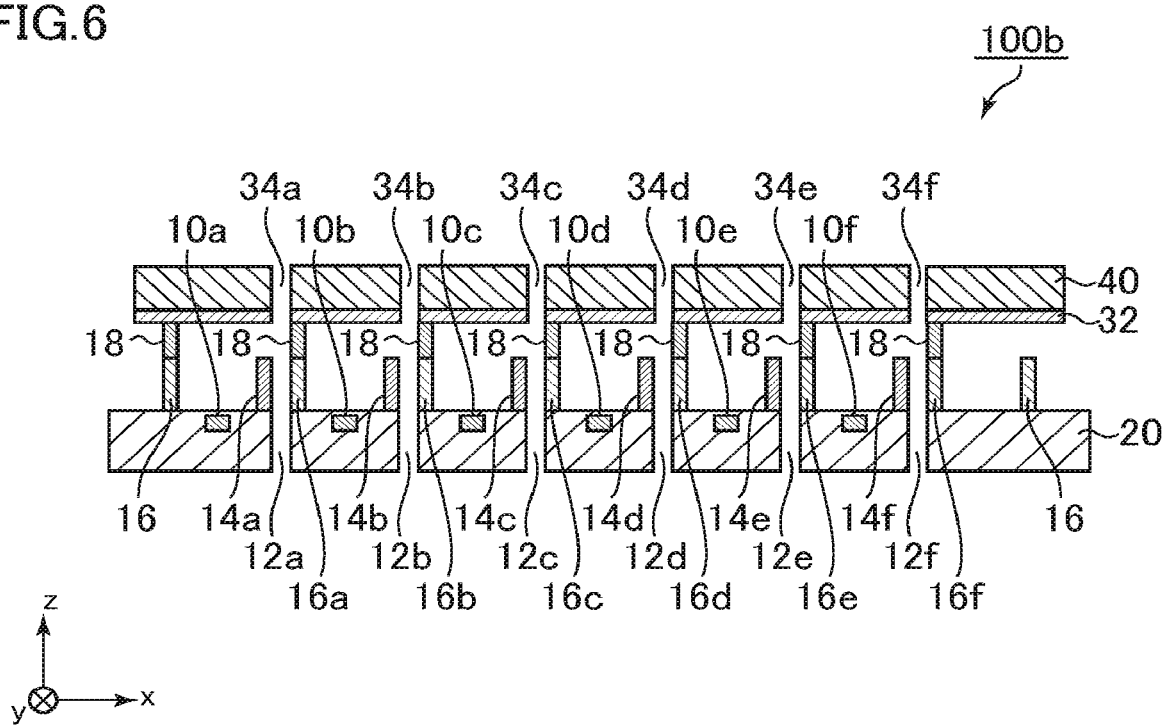
FIG. 6 is a schematic cross-sectional view of a semiconductor device according to a second embodiment.

FIG. 6 is a schematic cross-sectional view of a semiconductor device 100b according to the embodiment.

In the semiconductor device 100b, protrusions (bumps) 18 are provided between the ground electrodes 16 and the conductive films 32. As a result, even though a portion of the second substrate 40 is provided on the power supply electrode 14, the configuration where the power supply electrode 14 and the second substrate 40 are not in contact with each other and are not short-circuited is established. With this configuration, even in a case where the thicknesses of the power supply electrode 14 and the ground electrode 16 are the same, since the second substrate can be provided so as to cover the power supply electrode 14, the opening area of the second through-hole 34 can be further reduced, so that it is possible to suppress crosstalk.

The protrusion 18 is made of, for example, a conductor such as a metal.

Figure 7:
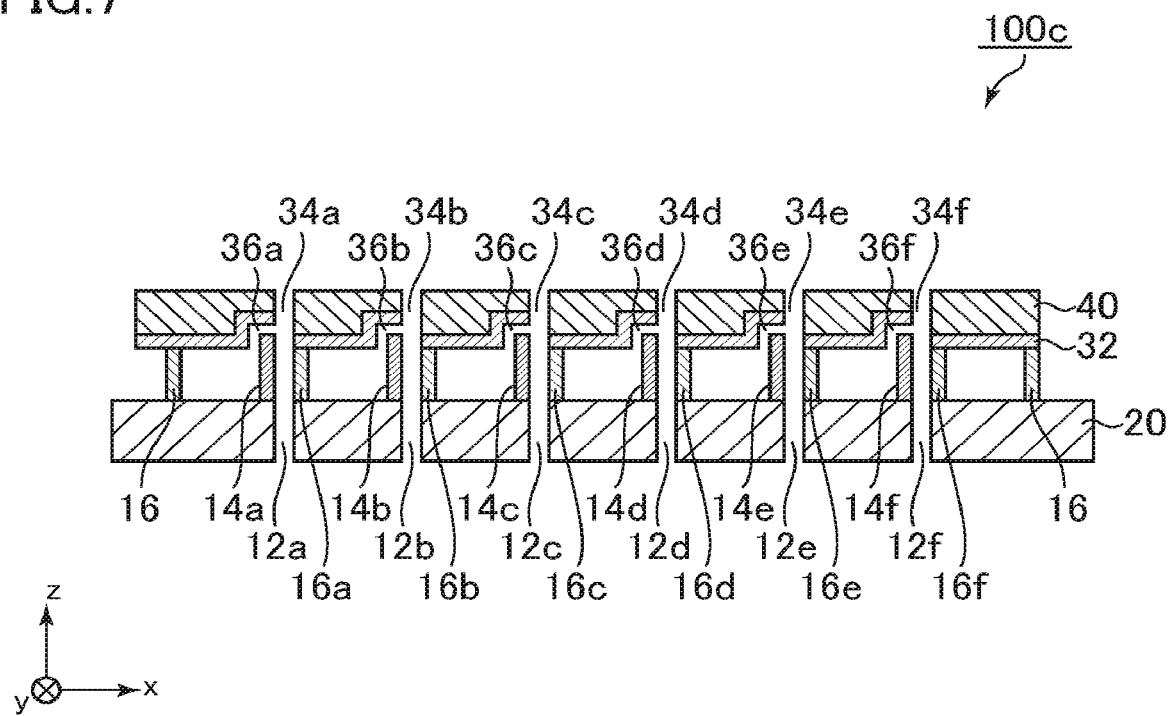
FIG. 7 is a schematic cross-sectional view of a semiconductor device according to another aspect of the second embodiment.

FIG. 7 is a schematic cross-sectional view of a semiconductor device 100c according to another aspect of the embodiment.

In the semiconductor device 100c, a plurality of recesses 36 are provided. The recesses 36a, 36b, 36c, 36d 36e, and 36f are provided on the respective power supply electrodes 14a, 14b, 14c, 14d, 14e, and 14f. Thereby, even though a portion of the second substrate 40 is provided on the power supply electrode 14, the configuration where the power supply electrode 14 and the second substrate 40 are not in contact with each other is established. The recess 36 is formed in consideration of $d_x$ and $d_y$ so as not to be in contact with the power supply electrode 14. The size of the recess 36 in the Z direction is preferably as small as possible. However, the size of the recess 36 is determined in consideration of the height variation of the power supply electrode 14 and the ground electrode 16 so that the substrate 1 and the substrate 2 are not short-circuited. With this configuration, since the second through-hole 34 can be provided so as to cover the power supply electrode 14, the opening area of the second through-hole 34 can be further reduced, so that it is possible to more reliably suppress crosstalk. The size of the second through-hole 34 can be determined in consideration of the bonding error.

According to the semiconductor devices 100b and 100c according to the embodiment, it is also possible to provide a semiconductor device capable of suppressing crosstalk.

Third Embodiment

A semiconductor device according to this embodiment is different from the semiconductor devices according to the first and second embodiments in that a first bonding material having conductivity and being provided on a surface facing the second substrate in a periphery of an array of through-holes of the first substrate, a second bonding material having conductivity and being provided on a surface facing the first substrate in a periphery of the second substrate, and a spacer provided between the first bonding material and the second bonding material are provided in the semiconductor device. Herein, the same contents as those of the first and second embodiment are omitted in description.

Figure 8:
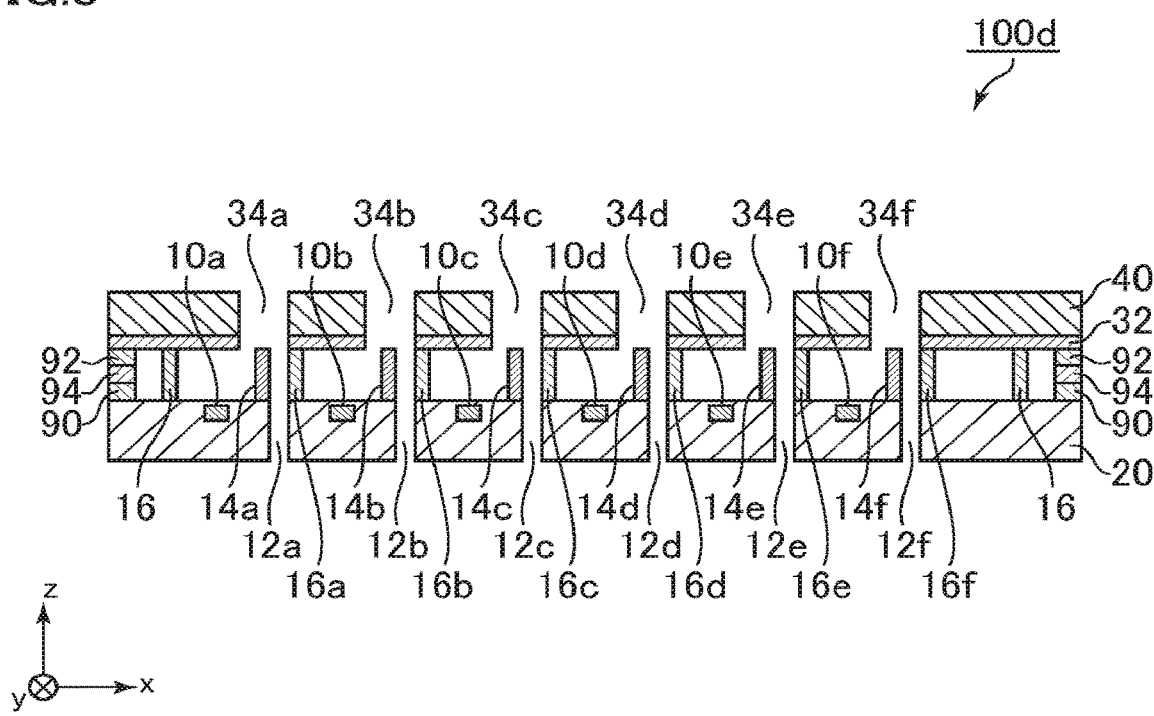
FIG. 8 is a schematic cross-sectional view of a semiconductor device according to a third embodiment.

FIG. 8 is a schematic cross-sectional view of a semiconductor device 100d according to the embodiment.

The first bonding material 90 and the second bonding material 92 are, for example, conductive adhesives containing silver (Ag) or the like. This is to suppress the charge-up of the semiconductor device 100d when the semiconductor device 100d is irradiated with the electron beam 120. The spacer 94 is, for example, Si. It is preferable that the first bonding material 90, the second bonding material 92, and the spacer 94 are provided in the array portion of the first through-holes 12 of the first substrate and in the periphery of the second substrate.

It is preferable that the sum of thicknesses of the first bonding material 90, the second bonding material 92, and the spacer 94 is about the same as or approximately equal to the thickness of the power supply electrode 14 or the ground electrode 16.

According to the semiconductor device 100d according to the embodiment, it is also possible to provide a semiconductor device capable of suppressing crosstalk.

While several embodiments and examples of the invention have been described, these embodiments and examples are presented byway of examples only and are not intended to limit the scope of the invention. These novel embodiments may be embodied in a variety of other forms; furthermore, various omissions, substitutions, and changes may be made without departing from the spirit of the inventions. These embodiments and modifications are included in the scope and spirit of the invention, and are included in the invention disclosed in the claims and their equivalents.

What is claimed is:

1. A semiconductor device comprising:
a first substrate having a plurality of first through-holes;
a plurality of first electrodes provided adjacent to each of the first through-holes on the first substrate;
a plurality of second electrodes provided on the first substrate to be adjacent to the first through-holes and to face the first electrodes, respectively;
a second substrate provided to face the first substrate, the second substrate having a plurality of second through-holes facing each of the first through-holes, the second substrate having a plurality of recesses, each of the recesses being provided above each of the first electrodes, each of the recesses being electrically isolated from each of the first electrodes, at least a surface of the second substrate facing the first substrate being conductive, the second substrate being electrically connected to the second electrodes; and
a circuit, disposed in the first substrate and being configured to apply a voltage between one of the first electrodes and one of the second electrodes, the voltage being configured to deflect a charged particle beam passing through one of the first through holes and one of the second through holes.

2. The semiconductor device according to claim 1, wherein the first through-hole and a portion of the first substrate are provided under the second through-hole.

3. The semiconductor device according to claim 1, wherein an opening shape of the second through-hole is substantially similar to a shape obtained by combining top surface shapes of the first electrode and the first through-hole.

4. The semiconductor device according to claim 1, wherein the second through-hole is larger than the first through-hole.

5. The semiconductor device according to claim 1, wherein the second through-hole is smaller than the first through-hole.

6. The semiconductor device according to claim 4, wherein the second substrate contains a heavy metal.

7. The semiconductor device according to claim 1, wherein a thickness of the second substrate is 10 µm or more.

8. The semiconductor device according to claim 1, wherein the second substrate has a conductive film on the surface facing the first substrate, and the conductive film is electrically connected to the second electrode.

9. The semiconductor device according to claim 1, wherein a portion of the second substrate is disposed on the first electrode.

10. The semiconductor device according to claim 6, further comprising a protrusion provided between the second electrode and the second substrate.

11. The semiconductor device according to claim 6, wherein the plurality of recesses faces the first electrode.

12. The semiconductor device according to claim 1, wherein a distance between the first electrode and the second substrate in a direction perpendicular to the second substrate is 30 µm or less.

13. The semiconductor device according to claim 1, wherein the second electrode has a grid shape and is provided to surround the first through-hole and the first electrode.

14. The semiconductor device according to claim 1, wherein, when a length of the first through-hole in a first direction parallel to the first substrate or the second substrate is denoted by $a_x$, a length of the first through-hole in a second direction parallel to the first substrate or the second substrate and intersecting the first direction is denoted by $a_y$, a length of the first electrode in the first direction is denoted by $b_x$, a length of the first electrode in a direction parallel to the second direction is denoted by $b_y$, a length of the second through-hole in the first direction is denoted by $L_x$, length of the second through-hole in the second direction is denoted by $L_y$, a deviation of the second substrate with respect to the first substrate in the first direction is denoted by $d_x$, and a deviation of the second substrate with respect to the first substrate in the second direction is denoted by $d_y$, $2d_x+b_x+a_x \leq L_x$, $2d_y+a_y \leq L_y$, and $2d_y+b_y \leq L_y$ are satisfied.

15. The semiconductor device according to claim 1, further comprising:
a first bonding material having conductivity and being provided on a surface facing the second substrate in a periphery of an array of through-holes of the first substrate;
a second bonding material having conductivity and being provided on a surface facing the first substrate in a periphery of the second substrate; and
a spacer provided between the first bonding material and the second bonding material.

16. The semiconductor device according to claim 1, wherein a sum of thicknesses of the first bonding material, the second bonding material, and the spacer is substantially equal to a thickness of the first electrode or a thickness of the second electrode.

17. The semiconductor device according to claim 1, wherein the spacer contains silicon.

* * * * *